(12) United States Patent
Ishii

(10) Patent No.: US 7,521,782 B2
(45) Date of Patent: Apr. 21, 2009

(54) OPTICAL DEVICE PACKAGE STRUCTURE

(75) Inventor: Yorishige Ishii, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 179 days.

(21) Appl. No.: 10/577,113

(22) PCT Filed: Oct. 13, 2004

(86) PCT No.: PCT/JP2004/015053

§ 371 (c)(1),
(2), (4) Date: Apr. 24, 2006

(87) PCT Pub. No.: WO2005/045944

PCT Pub. Date: May 19, 2005

(65) Prior Publication Data

US 2007/0080357 A1    Apr. 12, 2007

(30) Foreign Application Priority Data

Nov. 6, 2003 (JP) ............................. 2003-376967
Aug. 9, 2004 (JP) ............................. 2004-232371

(51) Int. Cl.
*H01L 23/02* (2006.01)

(52) U.S. Cl. .................. 257/680; 257/678; 257/98; 257/99; 257/100; 257/E33.056

(58) Field of Classification Search ............ 257/98, 257/99, 100, 432, 433, 676, E33.056, E33.058, 257/E33.059, E33.066, E33.067, E33.073, 257/E31.127

See application file for complete search history.

(56) References Cited

U.S. PATENT DOCUMENTS

| 5,907,151 A | 5/1999 | Gramann et al. |
| 6,396,082 B1 * | 5/2002 | Fukasawa et al. .............. 257/79 |
| 2004/0188699 A1 * | 9/2004 | Kameyama et al. ........... 257/99 |

FOREIGN PATENT DOCUMENTS

| DE | 195 27 026 A1 | 2/1997 |
| DE | 101 50 986 A1 | 4/2003 |
| EP | 0 809 304 A2 | 11/1997 |
| JP | 10-032351 | 2/1998 |
| JP | 2000-173947 | 6/2000 |
| JP | 2002-118270 | 4/2002 |
| JP | 2002118270 A * | 4/2002 |

* cited by examiner

*Primary Examiner*—Evan Pert
*Assistant Examiner*—Selim Ahmed
(74) *Attorney, Agent, or Firm*—Edwards Angell Palmer & Dodge LLP; David G. Conlin; Peter J. Manus

(57) ABSTRACT

An LED is mounted on a mounting portion of a lead frame with its light-emitting portion facing an aperture. Wires that connect the LED to lead portions of the lead frame are placed on the side on which the LED is mounted. A light-transmitting resin, which transmits light emitted from the LED, is placed on the side opposite from the LED mounted side of the lead frame. A low-stress resin, which seals the LED and the wire, is placed on the LED-mounted side of the lead frame. A crack prevention structure is constituted of bent portions that are provided at the lead portion and bent toward the LED-mounted side, low-stress resin portions located on the side opposite from the LED-mounted side with respect to the bent portions, and end portions of the light-transmitting resin put in contact with the low-stress resin portions.

18 Claims, 7 Drawing Sheets

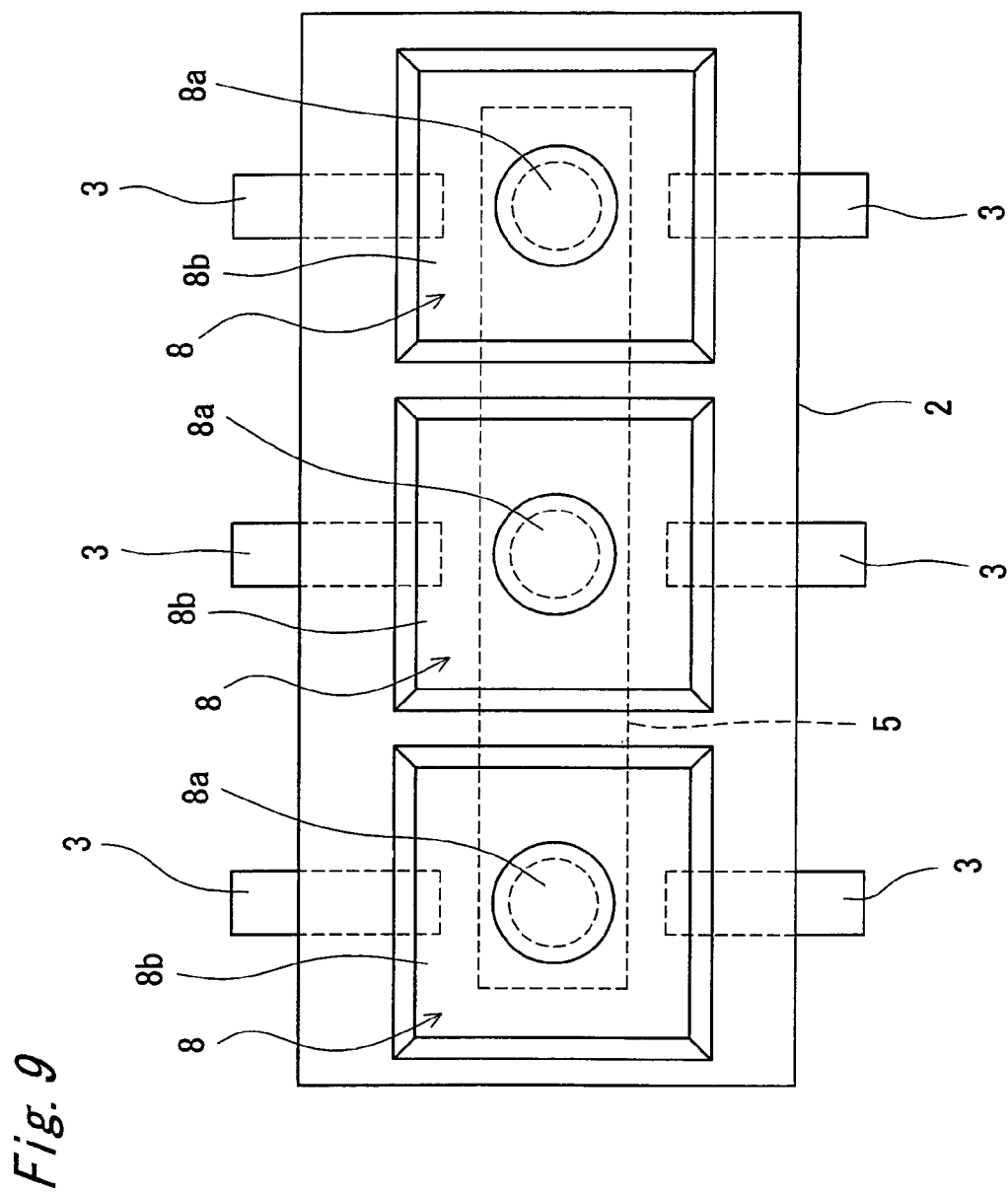

OPTICAL DEVICE PACKAGE STRUCTURE

CROSS-REFERENCES TO RELATED APPLICATIONS

This application is the US national phase of International Application PCT/JP2004/015053 filed Oct. 13, 2004, which designated the U.S. PCT/JP2004/015053 claims priority to JP Patent Applications No. 2003-376967 filed Nov. 6, 2003 and No. 2004-232371 filed Aug. 9, 2004. The entire contents of these applications are incorporated herein by reference.

BACKGROUND OF THE INVENTION

The present invention relates to an optical device package structure for use in comparatively severe temperature environments of, for example, optical communications, illuminations, automobiles and so on.

Conventionally, there has been an optical device package structure in which an optical device of CCD (charge coupled device) or the like is mounted on a device mounting portion of a lead frame, the optical device and lead portions of the lead frame are connected together via wires, and the optical device, the wires and the lead frame are sealed with a light-transmitting resin (refer to JP 2000-173947 A). The light-transmitting resin is formed into a roughly rectangular parallelepiped shape of a material that has a satisfactory transmission property with respect to light incident on the optical device. A lens is formed integrally with the upper surface of the light-transmitting resin, so that the light is made incident on the optical device via the lens. Moreover, the lead portions of the lead frame protrude from side surfaces of the light-transmitting resin, and the optical device package is connected to prescribed electrodes by the lead portions.

However, in the conventional optical device package structure, the light-transmitting resin is mixed with no filler for reducing the coefficient of linear expansion in order to secure the light transmission property of the light-transmitting resin. Therefore, the coefficient of linear expansion of the light-transmitting resin is several times the coefficient of linear expansion of each of the materials of the optical device and the wires. As a result, there is a problem that, when the optical device package structure is used in a severe temperature environment where the temperature changes within a range of, for example, −40° C. to 105° C., the rupture of the wires and the destruction of the optical device are caused by thermal stresses in the light-transmitting resin. There is a further problem that the light-transmitting resin cracks.

It is an object of the present invention to prevent the occurrence of the rupture of the wires and the destruction of the optical device and prevent the light-transmitting resin from cracking with regard to an optical device package structure.

SUMMARY OF THE INVENTION

An optical device package structure according to an aspect of the present invention includes:

an optical device;

a lead frame having a mounting portion on which the optical device is mounted and a lead portion electrically connected to the optical device;

a wire placed on a side of the lead frame on which side the optical device is mounted and electrically connecting the optical device with the lead portion;

a first resin transmissive to light and through which light incident on or emitted from the optical device passes; and a second resin at least part of which is placed on the side of the lead frame on which the optical device is mounted, the second resin sealing the optical device and the wire and having a coefficient of linear expansion lower than that of the first resin.

According to the construction, in the optical device package structure, the second resin that seals the optical device and the wire has a coefficient of linear expansion lower than that of the first resin. Therefore, even if the structure is used in an environment where the temperature change is comparatively large, thermal stresses exerted on the optical device and the wire are effectively reduced. Therefore, the problem of the destruction of the optical device and the problem of the rupture of the wire are effectively prevented.

In various embodiments, the optical device package structure further includes a crack prevention structure preventing the first resin from cracking. In this case, despite that the coefficient of linear expansion of the first resin is greater than the coefficient of linear expansion of the lead frame and so on, it becomes difficult to cause cracks in the first resin by virtue of the crack prevention structure. Therefore, even if the structure is used in an environment where the temperature change is comparatively large, the problem of the generation of cracks in the first resin is effectively prevented.

In one embodiment of the optical device package structure, the crack prevention structure includes:

a bent portion provided at the lead portion of the lead frame and bent toward the side on which the optical device is mounted;

a portion of the second resin located on the side opposite from the side on which the optical device is mounted with respect to the bent portion; and an end portion of the first resin put in contact with the portion of the second resin.

According to the embodiment, in the crack prevention structure, the bent portion is provided at the lead portion of the lead frame and bent toward the side on which the optical device is mounted. The portion of the second resin is located on the side opposite from the side on which the optical device is mounted with respect to the bent portion. The end portion of the first resin is put in contact with the portion of the second resin. With this arrangement, the shearing stress generated in the end portion of the first resin is effectively reduced. As a result, even if the structure is used in an environment where the temperature change is comparatively large, the problem of the generation of cracks in the first resin is effectively prevented.

In one embodiment of the optical device package structure, the crack prevention structure includes:

a recess portion provided at the lead portion of the lead frame and having a concavity on the side opposite from the side on which the optical device is mounted;

a portion of the second resin located inside the recess portion; and an end portion of the first resin put in contact with the portion of the second resin.

According to the embodiment, in the crack prevention structure, the recess portion is provided at the lead portion of the lead frame and has a concavity on the side opposite from the side on which the optical device is mounted. The portion of the second resin is located inside the recess portion. The end portion of the first resin is put in contact with the portion of the second resin. With this arrangement, the shearing stress generated in the end portion of the first resin is effectively reduced. As a result, even if the structure is used in an environment where the temperature change is comparatively large, the problem of the generation of cracks in the first resin is effectively prevented.

In one embodiment of the optical device package structure, the crack prevention structure includes:

a bent portion provided at the lead portion of the lead frame and bent toward the side on which the optical device is mounted; and an end portion of the first resin having an end surface that is aligned with an edge of the bent portion.

According to the embodiment, in the crack prevention structure, the bent portion is provided at the lead portion of the lead frame and bent toward the side on which the optical device is mounted. The end portion of the first resin having the end surface is aligned with the edge of the bent portion. With this arrangement, the shearing stress generated in the end portion of the first-resin is effectively reduced. As a result, even if the structure is used in an environment where the temperature change is comparatively large, the problem of the generation of cracks in the first resin is effectively prevented.

In one embodiment of the optical device package structure, the end surface of the end portion of the first resin is roughly flush with a surface of the bent portion located on the side opposite from the side on which the optical device is mounted.

According to the embodiment, by making the end surface of the end portion of the first resin roughly flush with the surface of the bent portion located at the lead portion of the lead frame, the shearing stress generated in the end portion of the first resin is reduced. Therefore, the problem of the generation of cracks in the first resin is effectively prevented.

In one embodiment of the optical device package structure, the second resin is formed by transfer molding.

According to the embodiment, the second resin is formed by transfer molding. Therefore, residual stresses generated in the optical device and the wire sealed with the second resin can effectively be reduced.

In one embodiment of the optical device package structure, the second resin contains no mold release agent.

According to the embodiment, the second resin contains no mold release agent, and therefore, adhesion between the second resin and the first resin is improved.

In one embodiment of the optical device package structure, the first resin contains filler that reduces the coefficient of linear expansion of the first resin.

According to the embodiment, the coefficient of linear expansion of the first resin is reduced by the filler, and therefore, a difference in the coefficient of linear expansion between the second resin and the lead frame is reduced. Therefore, an excessive thermal stress is prevented from being generated in the first resin, and the generation of cracks is effectively prevented.

It is noted that the amount of the filler mixed in the first resin should preferably be such that the light transmission property of the first resin is not largely reduced.

In one embodiment of the optical device package structure, the crack prevention structure comprises the first resin, the first resin has a lens portion that collects light incident on or emitted from the optical device and a base portion that is continuous to the lens portion, and the base portion has a thickness of not greater than 0.5 mm.

According to the embodiment, the stress concentrated to the base portion of the first resin is reduced. Therefore, the generation of cracks in the first resin is effectively prevented.

In one embodiment of the optical device package structure, the crack prevention structure comprises the first resin, and the first resin has a lens portion that collects light incident on or emitted from the optical device and a base portion continuous to the lens portion and has an area smaller than an area of the mounting portion of the lead frame when viewed from a direction of emission or incidence of the light.

According to the embodiment, the stress concentrated to the base portion of the first resin is reduced. Therefore, the generation of cracks in the first resin is effectively prevented.

In one embodiment of the optical device package structure, the crack prevention structure comprises the first resin, the first resin has a lens portion that collects light incident on or emitted from the optical device and a base portion continuous to the lens portion and has an area smaller than an area of the mounting portion of the lead frame when viewed from a direction of emission or incidence of the light, and the base portion has a thickness smaller than a thickness of the lens portion.

According to the embodiment, the stress concentrated to the base portion of the first resin is reduced. Therefore, the generation of cracks in the first resin is effectively prevented.

In one embodiment of the optical device package structure, the second resin has a part placed on the side opposite from the side of the lead frame on which the optical device is mounted, and the part of the second resin is placed at least in a part of a portion other than the portion of the lead frame where the first resin is placed.

According to the embodiment, the part of the second resin is placed on the same side as the side of the lead frame on which the first resin is placed. Therefore, for example, the device can be mounted on other equipment or the like by using the part of the second resin as a reference. Therefore, an optical device package structure capable of being aligned in position on the basis of the external shape can be obtained.

In one embodiment of the optical device package structure, the crack prevention structure comprises the first resin, and the first resin has a lens portion that collects light incident on or emitted from the optical device and a base portion continuous to the lens portion and is bonded to at least the lead frame with an adhesive material.

According to the embodiment, the first resin is formed separately from the lead frame without using, for example, insert molding and bonded to the lead frame with the adhesive material. Therefore, the generation of a stress due to molding shrinkage as in the case where it is formed by, for example, insert molding can be prevented. As a result, the generation of cracks in the first resin can effectively be prevented.

In one embodiment of the optical device package structure, the adhesive material contains a resin that has a glass transition point lower than a lowest storage temperature.

According to the embodiment, the adhesive material contains the resin that has a glass transition point lower than the lowest storage temperature, and therefore, the elasticity of the adhesive material is comparatively large in the normal use environment of the optical device package structure. Therefore, since the shearing stress generated between the first resin and the lead frame can be reduced, the generation of cracks in the first resin can effectively be prevented. It is noted that the storage temperature means an ambient temperature range in which the resin can be preserved without applying an electrical load, as provided by JIS-C7021-B10.

In one embodiment of the optical device package structure, the adhesive material contains a resin that has a curing point of not lower than a lowest storage temperature and not higher than a highest storage temperature.

According to the embodiment, the adhesive material contains the resin that has the curing point of not lower than the lowest storage temperature and not higher than the highest storage temperature. Therefore, the thermal stresses caused by the curing can be comparatively reduced during the curing of the adhesive material. Therefore, since the shearing stress generated in the first resin can be reduced, the generation of cracks in the first resin can effectively be prevented.

In one embodiment of the optical device package structure, the crack prevention structure comprises the first resin, and the first resin has a plurality of lens portions that collect light incident on or emitted from the optical device and a plurality of base portions continuous to the respective lens portions, and the plurality of combined lens portions and base portions are mutually separated.

According to the embodiment, the plurality of combined lens portions and base portions are mutually separated, and therefore, the stress concentrated to the base portions of the first resin is reduced. Therefore, the generation of cracks in the first resin is effectively prevented.

As described above, in the optical device package structure of the present invention, the first resin that transmits the light incident on or emitted from the optical device is placed on one side of the mounting portion of the lead frame, the second resin that seals the optical device and the wire is placed on the other side of the mounting portion, and the second resin has a coefficient of linear expansion lower than that of the first resin. Therefore, even if the optical device package structure is used in an environment where the temperature change is comparatively large, thermal stresses exerted on the optical device and the wire are effectively reduced. Therefore, the problem of the destruction of the optical device and the problem of the rupture of the wire are effectively prevented.

Moreover, the problem of the generation of cracks in the first resin is effectively prevented by virtue of the crack prevention structure, despite that the coefficient of linear expansion of the first resin is greater than the coefficient of linear expansion of the lead frame and so on, and even if the structure is used in an environment where the temperature change is comparatively large.

BRIEF DESCRIPTION OF THE DRAWINGS

FIG. 9 is a sectional view showing the optical device package structure of a modified example of the fifth embodiment.

DETAILED DESCRIPTION OF THE INVENTION

Figure 1A:
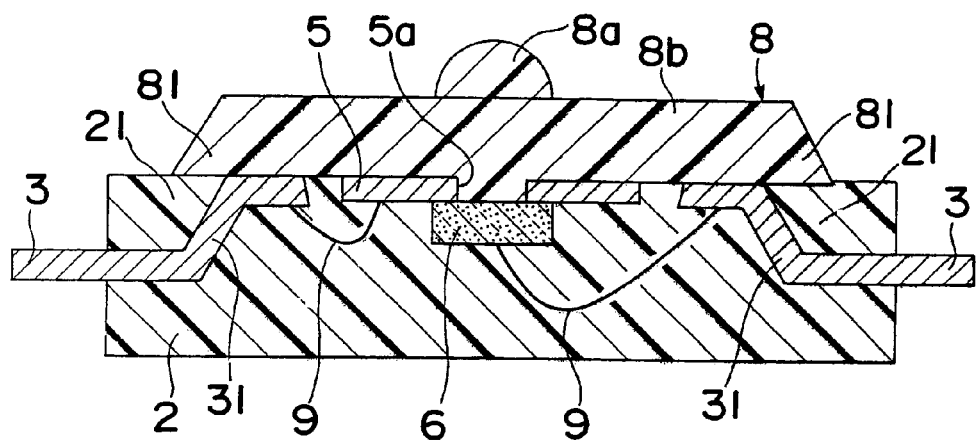
FIG. 1A is a sectional view showing the optical device package structure of a first embodiment of the present invention.

The present invention will now be described by the embodiments shown in the drawings.

FIRST EMBODIMENT

Figure 1B:
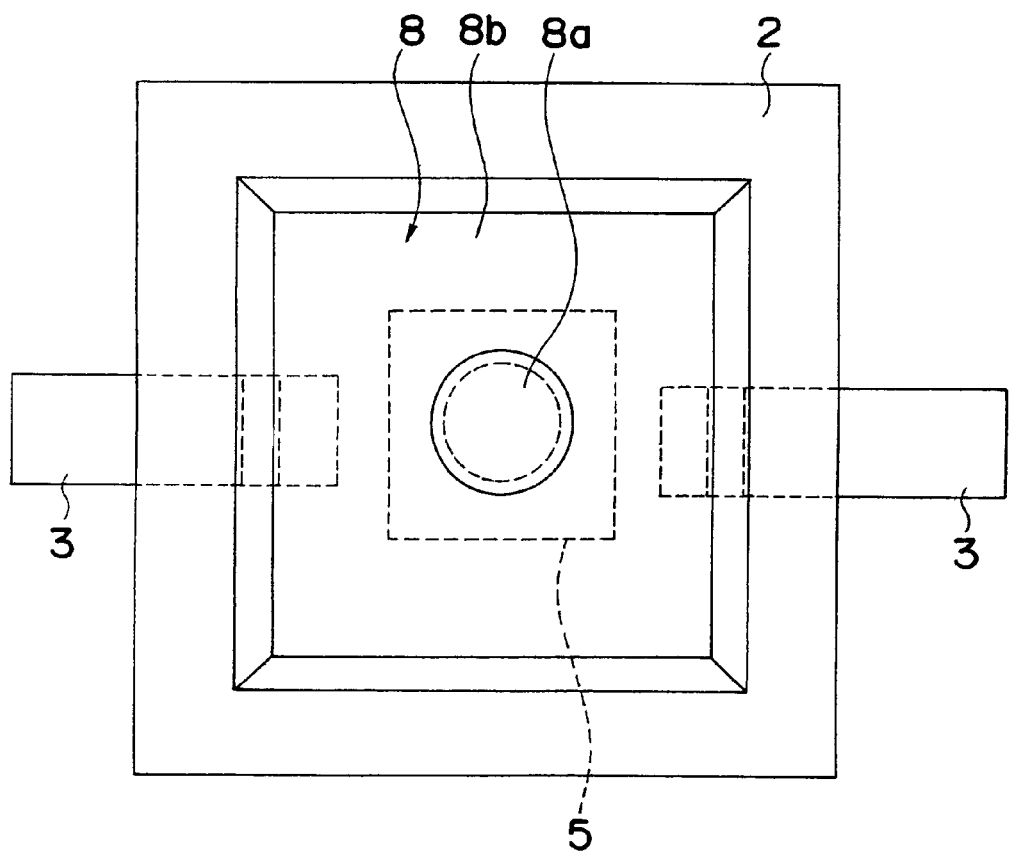
FIG. 1B is a plan view showing the optical device package structure of the first embodiment.

FIG. 1A is a sectional view showing the optical device package structure of a first embodiment of the present invention. FIG. 1B is a plan view showing the optical device package structure of the first embodiment.

In the optical device package structure, an LED (light-emitting diode) 6 as the optical device is mounted on the lower surface side of a mounting portion 5 of a lead frame in FIG. 1. An aperture 5a through which light emitted from the LED 6 passes is provided at the mounting portion 5 of the lead frame, and the light-emitting portion of the LED 6 faces the aperture 5a. The LED 6 is electrically connected to lead portions 3 of the lead frame via wires 9. The wires 9 are placed on the side of the lead frame in the mounting portion on which side the LED 6 is mounted. The LED 6 and the wires 9 are sealed with a low-stress resin 2 containing silica as filler. The low-stress resin 2 is placed on the side of the lead frame in the mounting portion 5 on which side the LED 6 is mounted. On the other hand, a light-transmitting resin 8, which is made of a material that has light-permeability to the light emitted from the light LED 6, is placed on the side opposite from the side of the lead frame in the mounting portion 5 on which side the LED 6 is mounted. The light-transmitting resin 8 is constituted by integrally forming a lens portion 8a that condenses the light emitted from the LED 6 with a base portion 8b that supports the lens portion 8a. The base portion 8b has a trapezoidal shape in the cross section and has a rectangular shape in the plan. The low-stress resin 2 is provided by a resin of which the coefficient of linear expansion is totally reduced by incorporating filler of silica or the like of which the coefficient of linear expansion is small into, for example, epoxy resin. The light-transmitting resin 8 is provided by, for example, a transparent epoxy resin.

The optical device package structure has a crack prevention structure. The crack prevention structure is constructed of bent portions 31 provided at the lead portions 3 of the lead frame, a low-stress resin portion 21 located on the side opposite from the side on which the LED 6 is mounted with respect to the bent portions 31, and an end portion 81 of the light-transmitting resin put in contact with the low-stress resin portion 21. The bent portions 31 of the lead portions 3 of the lead frame are bent toward the side on which the LED 6 is mounted.

In the optical device package structure of the construction, the LED 6 and the wires 9 are sealed with the low-stress resin 2, and the coefficient of linear expansion of the low-stress resin 2 has a value close to the coefficient of linear expansion of the LED 6 formed of Si (silicon) and GaAs (gallium arsenide) and the coefficients of linear expansion of the lead frame and the wires. Therefore, even if the structure is used in an environment where the temperature change is comparatively large, thermal stresses exerted on the LED 6 and the wires 9 can effectively be reduced. As a result, the problem of the destruction of the LED 6 and the problem of the rupture of the wires 9 can effectively be prevented.

Moreover, since the optical device package structure has the crack prevention structure, the cracks of the light-transmitting resin 8 can effectively be prevented even when the structure is used in an environment where the temperature change is comparatively large. That is, the light-transmitting resin 8, which is mixed with no filler to maintain a satisfactory transmission property with respect to the light from the LED 6, therefore has a coefficient of linear expansion several times the coefficient of linear expansion of the lead frame and the low-stress resin 2. However, since the end portions 81 of the light-transmitting resin are put in contact with the low-stress resin portions 21, a shearing stress generated in the end portions 81 of the light-transmitting resin becomes smaller than when, for example, the end portions are put in contact with the lead portions of the lead frame. As a result, the generation of cracks in the light-transmitting resin 8 can effectively be prevented.

Moreover, the optical device package structure can easily be produced by separately forming the low-stress resin 2 and the light-transmitting resin 8 on the lower side and the upper side, respectively, of the lead frame. That is, time and labor needed for the positioning and so on of a lens made of glass are less than when, for example, the lens made of glass for condensing the light emitted from the LED is formed of the low-stress resin by insert molding, and therefore, the structure can easily be produced. Moreover, since the low-stress resin 2 is placed only on the side of the lead frame on which the LED 6 is mounted, the flowability of the resin in a metal mold during molding is more satisfactory than when both sides of the lead frame are sealed with only the light-transmitting resin as in the conventional case. Therefore, the problem that voids enter the sealing resin can be prevented. Moreover, the position where the gate of the metal mold for the molding is located can be set under comparatively few limitations. Therefore, the optical device package structure can be produced by coinjection molding comparatively easily at low cost.

SECOND EMBODIMENT

Figure 2:
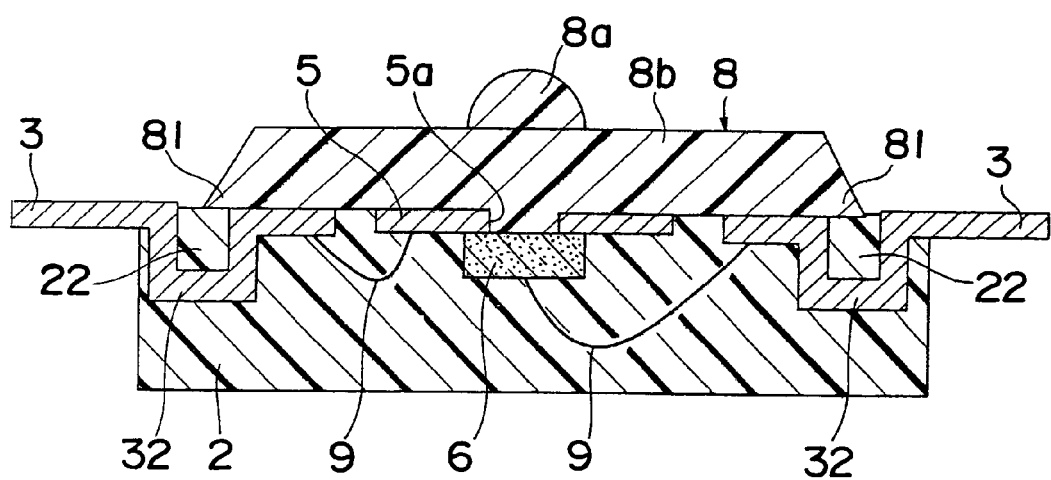
FIG. 2 is a sectional view showing the optical device package structure of the second embodiment.

FIG. 2 is a sectional view showing the optical device package structure of the second embodiment.

The optical device package structure of the second embodiment differs from the optical device package structure of the first embodiment only in the construction of the crack prevention structure. In the second embodiment, the same components as those of the first embodiment are denoted by the same reference numerals, and no detailed description is provided therefor.

The crack prevention structure owned by the optical device package structure of the second embodiment is constructed of recess portions 32 provided at the lead portions 3 of the lead frame, low-stress resin portions 22 located in the recess portions 32 and end portions 81 of the light-transmitting resin put in contact with the low-stress resin portions 22. The recess portions 32 of the lead portions of the lead frame have a concavity on the side opposite from the side on which the LED 6 is mounted.

Even when used in an environment where the temperature change is comparatively large, the optical device package structure of the present embodiment can effectively prevent the cracks of the light-transmitting resin 8 by virtue of the crack prevention structure. That is, since the end portions 81 of the light-transmitting resin are put in contact with the low-stress resin portion 22 in the crack prevention structure, a shearing stress generated in the end portions 81 of the light-transmitting resin is effectively reduced. Therefore, the generation of cracks in the light-transmitting resin 8 can effectively be prevented despite that the resin has a coefficient of linear expansion several times the coefficient of linear expansion of the lead frame and the low-stress resin 2.

THIRD EMBODIMENT

Figure 3:
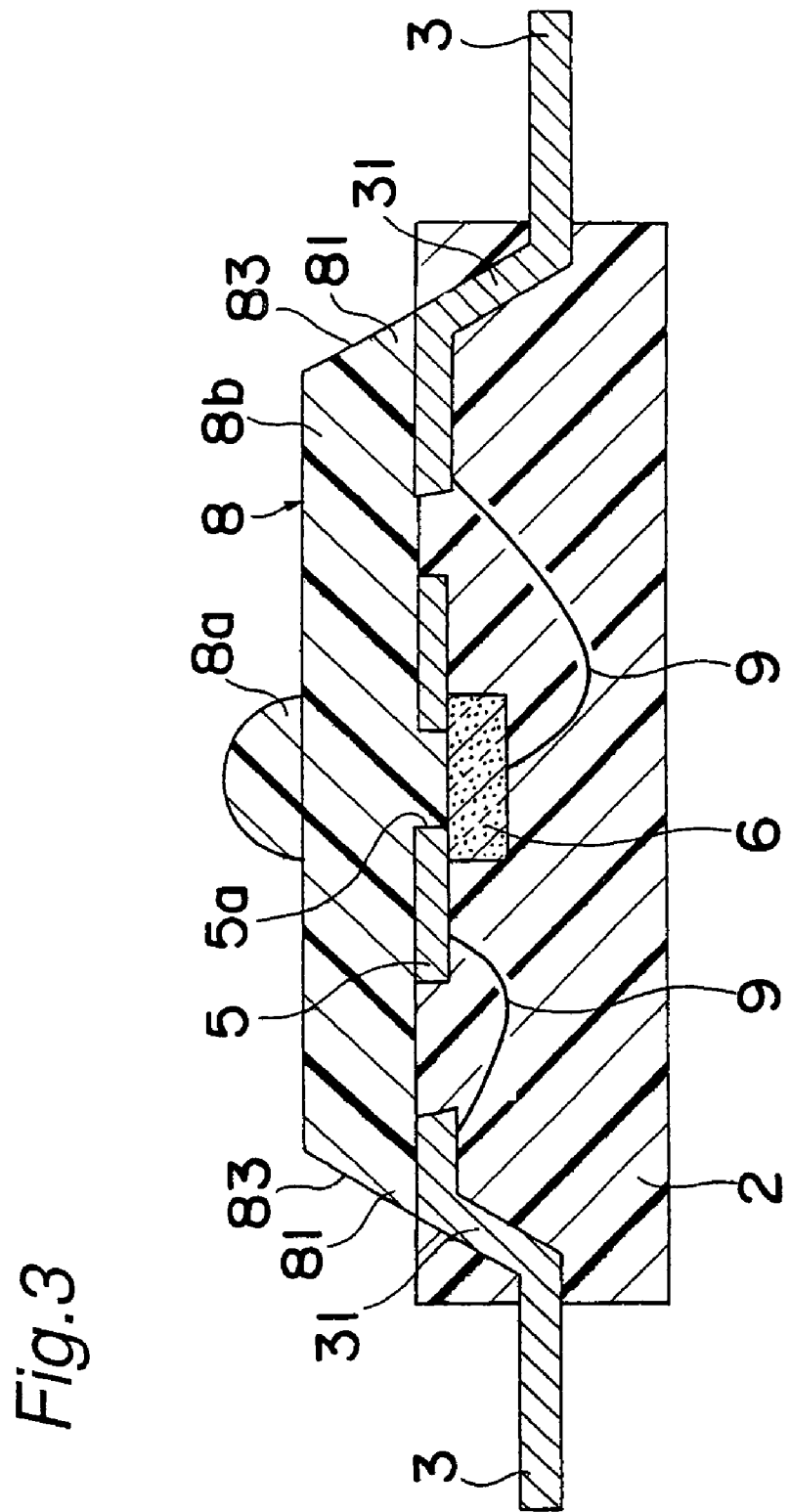
FIG. 3 is a sectional view showing the optical device package structure of the third embodiment.

FIG. 3 is a sectional view showing the optical device package structure of the third embodiment.

The optical device package structure of the third embodiment differs from the optical device package structure of the first embodiment only in the construction of the crack prevention structure. In the third embodiment, the same components as those of the first embodiment are denoted by the same reference numerals, and no detailed description is provided therefor.

The crack prevention structure owned by the optical device package structure of the third embodiment is constructed of bent portions 33 provided at the lead portion 3 of the lead frame and end portions 81 of a light-transmitting resin, which has end surfaces 83 that are aligned with the edges of the bent portions 33. The bent portions 33 of the lead portions of the lead frame are bent toward the side on which the LED 6 is mounted.

Even when used in an environment where the temperature change is comparatively large, the optical device package structure of the present embodiment can effectively prevent the cracks of the light-transmitting resin 8 by virtue of the crack prevention structure. That is, with the construction in which the end portions 81 of the light-transmitting resin are put in contact with the bent portions 33 of the lead portion and the end surfaces 83 at the end portions of the light-transmitting resin are aligned with the edges of the bent portions 33 in the crack prevention structure, the shearing stresses generated in the end portions 81 of the light-transmitting resin are effectively reduced. Therefore, the generation of cracks in the light-transmitting resin 8 can effectively be prevented despite that the light-transmitting resin 8 has a coefficient of linear expansion several times the coefficient of linear expansion of the lead frame and the low-stress resin 2.

In each of the embodiments, the forming method of the light-transmitting resin 8 is not particularly limited. On the other hand, the low-stress resin 2, which seals the LED 6, the wires 9 and so on, should preferably be formed by transfer molding in order to reduce the residual stresses in these parts.

Moreover, no mold release agent should preferably be used for the low-stress resin 2. This is because, if a mold release agent is used for the low-stress resin, the mold release agent sometimes exudes out of the low-stress resin and adversely affects the adhesion between the low-stress resin and the light-transmitting resin when the light-transmitting resin is formed after the formation of the low-stress resin.

Moreover, it is acceptable to mix the light-transmitting resin 8 with filler of silica or the like to the extent that the light transmission property (light transmittance) is not impaired for a reduction in the coefficient of linear expansion. With this arrangement, the shearing stress generated in the light-transmitting resin can further be reduced, and the generation of cracks in the light-transmitting resin can more effectively be prevented.

Moreover, the LED 6 may be another optical device of, for example, CCL;, VCSEL (vertical-cavity surface-emitting laser), PD (photodiode) or the like.

Moreover, the shapes of the light-transmitting resin 8 and the low-stress resin 2 are not limited to the rectangular parallelepiped shape but changeable to other shapes at need.

Moreover, the shape of the lead frame can be changed to another shape at need. For example, the mounting portion 5 and the lead portions 3 may be integrally formed, and any number of lead portions 3 may be provided.

EXAMPLES

The optical device package structures of the first through third embodiments were produced and subjected to tests in an environment where the temperature changed within the range of −40° C. to 105° C. Moreover, shearing stresses generated under the test conditions were calculated by simulation by FEM (finite element method) using a computer with regard to the optical device package structures of the first through third embodiments. Further, as a comparative example, a test of an optical device package structure that did not have the crack prevention structure of the present invention and calculation of a shearing stress were carried out.

Figure 4:
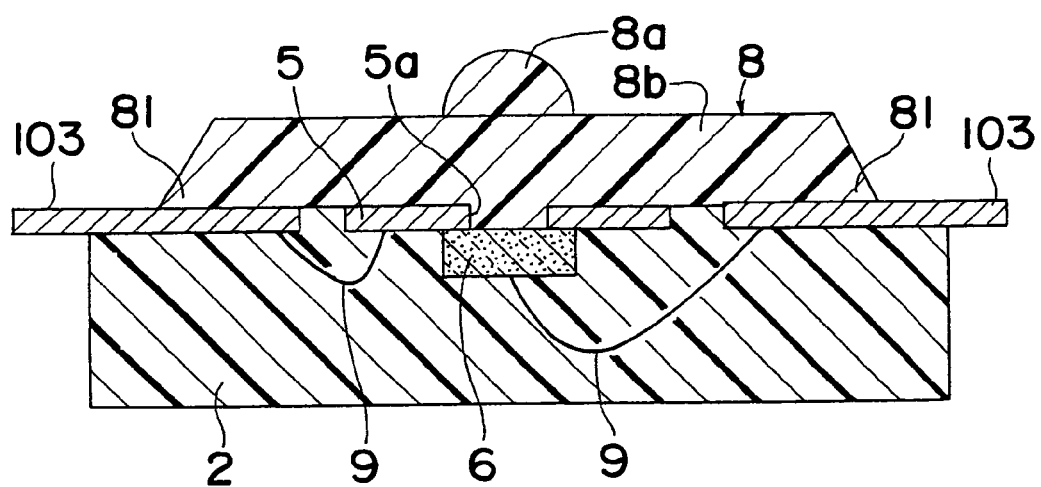
FIG. 4 is a sectional view showing the optical device package structure of a comparative example.

FIG. 4 is a sectional view showing the optical device package structure of a comparative example. The optical device package structure has the same components as those of the optical device package structure of the first embodiment except that the lead portions 103 of the lead frame project sideward along a borderline between the light-transmitting resin 8 and the low-stress resin 2 and no crack prevention structure is provided. In the example shown by F*ig*. 4, the same components as those of the first embodiment shown by F*ig*. 1 are denoted by the same reference numerals.

Materials used in producing the optical device package structures of the first through third embodiments and the comparative example are as follows. That is, EME6710 produced by Sumitomo Bakelite Company Limited was used for the low-stress molding resin 2. Moreover, NT600 produced by Nitto Denko Corporation was used for the light-transmitting resin 8, and a copper alloy KFC produced by Kobe Steel, Ltd. was used for the lead frame. Then, the low-stress resin 2 was formed to a thickness of 2 mm, the light-transmitting resin 8 was formed to a thickness of 1 mm, and the lead frame was formed to a thickness of 0.25 mm. With theses constituent parts, package structures of a package size of 6 mm square were produced.

Table 1 shows the physical properties of the materials of the constituent parts.

TABLE 1

|  | Coefficient of linear expansion (ppm/k) | Young's modulus (GPa) | Poisson's ratio |
|---|---|---|---|
| GaAs | 5.9 | 85.5 | 0.55 |
| Si | 2.8 | 187 | 0.25 |
| Au | 14.2 | 78 | 0.44 |
| Cu alloy | 17 | 128 | 0.35 |
| Light-emitting resin | 60-70 | 3-3.5 | 0.3 |
| Low-stress resin | 8-18 | 15-30 | 0.25-0.3 |

As shown in Table 1, since the filler is mixed, the coefficient of linear expansion of the low-stress resin 102 has a value close to the coefficient of linear expansions of the Cu alloy used for the lead frame, Au used for the wires and GaAs and Si used for the LED 6. On the other hand, the light-transmitting resin 108, which is mixed with no filler in order to avoid the reduction in the transmission property with respect to the light emitted from the LED 6, has a coefficient of linear expansion several times that of the other structural materials.

The optical device package structures of the first through third embodiments and the comparative example were produced with the materials that had the physical properties shown in Table 1. The package structures were produced by insert molding the low-stress resin 2 into the lead frame on which the LED 6 was mounted and thereafter carrying out the molding of the light-transmitting resin 108. These optical device package structures were subjected to a temperature cycling test while being disposed in an environment where the temperature changed within the range of −40° C. to 105° C.

As a result, cracks were generated in the light-transmitting resin 8 of the comparative example. Concretely, in FIG. 4, cracks were generated most frequently in the portions of the end portions 81 of the light-transmitting resin put in contact with the lead portions 103 of the lead frame and in contact with the low-stress resin 8. Cracks were generated second most frequently in the portions of the end portions 81 of the light-transmitting resin put in contact with the lead portions 103 of the lead frame. The generation of these cracks is presumably chiefly ascribed to the shearing stresses generated in the end portions 81 of the light-transmitting resin due to a difference in the coefficient of linear expansion between the components put in mutual contact.

On the other hand, in the optical device package structures of -the first through third embodiments, almost no crack generation was observed at the end portions 81 of the light-transmitting resin. This is presumably ascribed to the fact that the low-stress resin portions 21 and 22 put in contact with the end portions 81 of the light-transmitting resin had a comparatively small young's modulus although the coefficient of linear expansion thereof is different from that of the light-transmitting resin 8 in the first and second embodiments, and therefore, the shearing stresses generated at the boundaries between these resins were comparatively small. Moreover, in the second embodiment, the shearing stresses at the end portions 81 of the light-transmitting resin were reduced by the formation of the end surfaces 83 at the end portions of the light-transmitting resin in alignment with the edges of the bent portions 31 of the lead portions of the lead frame.

According to the test results, the generation of excessive shearing stresses in the first resin was prevented presumably by the formation of the lead portions 3 of the lead frame so that the lead portions protruded from only the second resin instead of protruding from the boundary between the light-transmitting resin as the first resin and the low-stress resin as the second resin in the first and second embodiments. Moreover, the generation of excessive shearing stresses in the first resin was prevented presumably by the formation of the lead portions 3 of the lead frame so that the edges of the bent portions were located at the boundary between the light-transmitting resin as the first resin and the low-stress resin as the second resin in the second embodiment.

Table 2 shows the calculation results of a simulation by FEM with regard to the optical device package structures of the first through third embodiments and the comparative example. With regard to the simulation, a simulation corresponding to the temperature cycling test was carried out by varying the temperature condition between −40° C. and 105° C. with a point at which the total 15 stress of the package structure would become zero set at 120° C. since the glass transition point of the light-transmitting resin 8 is 120° C.

TABLE 2

|  | Shearing stress in position A (MPa) | Shearing stress in position B (MPa) |
|---|---|---|
| Comparative example | 70 | 51 |
| First embodiment | 35.8 | 28 |
| Second embodiment | 35.8 | 28 |
| Third embodiment | 45.8 | 40 |

In Table 2, the position A is the portion where the light-transmitting resin 8 is put in contact with the widthwise edges of the lead portions 3 and 103 of the lead frame and the low-stress resin 2 at the end portions 81 of the light-transmitting resin or in the neighborhoods of the end portions 81 of the light-transmitting resin. The position B is the portion where the light-transmitting resin 8 is put in contact with the widthwise centers of the lead portions 3 and 103 of the lead frame at the end portions 81 of the light-transmitting resin or in the neighborhoods of the end portions 81 of the light-transmitting resin.

The simulation results of Table 2 satisfactorily correspond to the results of the temperature cycling test with the real things. The NT600 produced by Nitto Denko Corporation used for producing the light-transmitting resin 8 has a bending strength of 130 MPa. Since the shearing strength of a resin is generally one third of its bending strength, it can be estimated that the shearing strength of the light-transmitting resin 8 is about 45 MPa. It can be judged that shear fracture easily occurs when the value of the shearing stress calculated by the simulation exceeds the shearing strength of the light-transmitting resin. Actually, in the comparative example of which the shearing stress obtained by the simulation calculation largely exceeded 45 MPa in both the positions A and B, many cracks were generated in the end portions 81 of the light-transmitting resin in the temperature cycling test. On the other hand, according to the first and second embodiments of which the shearing stress obtained by the simulation calculation fell below 45 MPa in both the positions A and B, no crack was generated in the end portions 81 of the light-transmitting resin in the temperature cycling test. Moreover, no crack was generated in the end portions 81 of the light-transmitting resin through the temperature cycling test although the shearing stress obtained by the simulation calculation slightly exceeded 45 MPa in the position A in the third embodiment.

According to these results, the cracks generated in the light-transmitting resin 8 are presumably ascribed to the generation of an extremely large shearing stress in the portions where the end portions 81 of the light-transmitting resin are put in contact with the lead portions 103 of the lead frame and particularly in the portions that are located at both widthwise ends of the lead portions 103 and also put in contact with the low-stress resin 2. In this case, according to the optical device package structure of the present invention, which can effectively reduce the shearing stresses at the end portions 81 of the light-transmitting resin by virtue of the crack prevention structure, is presumably able to effectively prevent the cracks of the light-transmitting resin 8.

FOURTH EMBODIMENT

Figure 5:
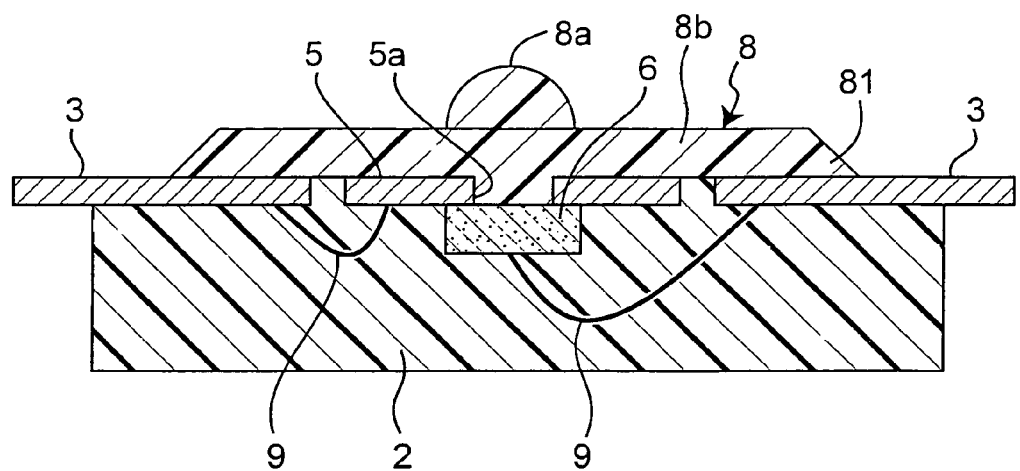
FIG. 5 is a sectional view showing the optical device package structure of the fourth embodiment.

FIG. 5 is a sectional view showing the optical device package structure of the fourth embodiment.

The optical device package structure of the fourth embodiment differs from the optical device package structure of the first embodiment only in the construction of the crack prevention structure. In the fourth embodiment, the same components as those of the first embodiment are denoted by the same reference numerals, and no detailed description is provided therefor.

The crack prevention structure owned by the optical device package structure of the present embodiment is provided by setting the thickness of the base portion 8 b of the light-transmitting resin 8 to a prescribed thickness. It is noted that the base portion 8b means the portion that supports the lens 8a of the light-transmitting resin 8. A thermal stress generated in the light-transmitting resin 8 is caused chiefly by differences in the coefficient of linear expansion and the young's modulus from those of the lead frames 3 and 5. In particular, the thicker the thickness of base portion 8b of the light-transmitting resin 8, the greater the shearing stress generated between the lead frames 3 and 5 and the light-transmitting resin 8 results, making it easy to cause a stress concentration at the end portions of the light-transmitting resin 8 and to generate cracks.

In this case, by setting the thickness of the base portion 8b of the light-transmitting resin 8 to 0.5 mm or less, the shearing stress generated in the end portions 81 of the light-transmitting resin can effectively be reduced. That is, the generation of cracks in the light-transmitting resin 8 can effectively be prevented by the crack prevention structure although the light-transmitting resin 8 has a coefficient of linear expansion several times the coefficient of linear expansion of the lead frames 3 and 5 and the low-stress resin 2.

The thickness of the base portion 8b of the light-transmitting resin 8 should preferably be as thin as possible from the viewpoint of preventing cracks. However, taking the problem of the flowability of the resin during molding into consideration, the lower limit should preferably be set to about 0.3 mm.

FIFTH EMBODIMENT

Figure 6:
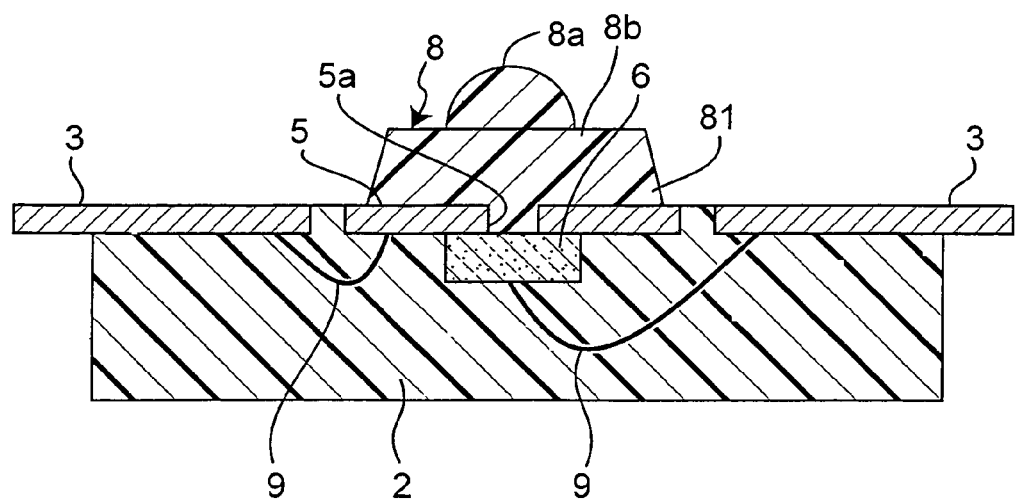
FIG. 6 is a sectional view showing the optical device package structure of the fifth embodiment.

FIG. 6 is a sectional view showing the optical device package structure of the fifth embodiment.

The optical device package structure of the fifth embodiment differs from the optical device package structure of the first embodiment only in the construction of the crack prevention structure. In the fifth embodiment, the same components as those of the first embodiment are denoted by the same reference numerals, and no detailed description is provided therefor.

The crack prevention structure owned by the optical device package structure of the present embodiment is provided by making the area of the light-transmitting resin 8 smaller than the area of the mounting portion 5 of the lead frame when viewed from the light-emitting direction of the LED 6. It is noted that the light-transmitting resin 8 is formed of the lens portion 8a and the base portion 8b that supports the lens portion 8a, and the area of the light-transmitting resin 8 is the same as the area of the base portion 8b. The thermal stress generated in the light-transmitting resin 8 is caused chiefly by the differences in the coefficient of linear expansion and the young's modulus from those of the lead frames 3 and 5. In particular, the greater the area of the light-transmitting resin 8, the greater the shearing stress generated between the resin and the lead frames 3 and 5 in the neighborhood of the end portions of the light-transmitting resin 8, making it easy to cause a stress concentration at the end portions of the light-transmitting resin 8 and to generate cracks.

In this case, by making the area of the light-transmitting resin 8 smaller than the area of the mounting portion 5 of the lead frame when viewed from the light-emitting direction of the LED 6, the shearing stress generated in the end portions 81 of the light-transmitting resin can effectively be reduced. That is, the generation of cracks in the light-transmitting resin 8 can effectively be prevented by the crack prevention structure despite that the light-transmitting resin 8 has a coefficient of linear expansion several times the coefficient of linear expansion of the lead frames 3 and 5 and the low-stress resin 2.

Moreover, by reducing the thickness and the area of the light-transmitting resin 8 by combining the fourth embodiment with the fifth embodiment, the generation of cracks in the light-transmitting resin 8 can more effectively be prevented. Moreover, when the light-transmitting resin 8 is formed of a plurality of lens portion 8a, 8a, . . . and a plurality of base portions 8b, 8b, . . . continuous to the plurality of lens portions 8a as shown in FIG. 9, the generation of cracks in the light-transmitting resin 8 can more effectively be prevented by mutually separating the plurality of combined lens portions 8a and base portions 8b.

SIXTH EMBODIMENT

Figure 7:
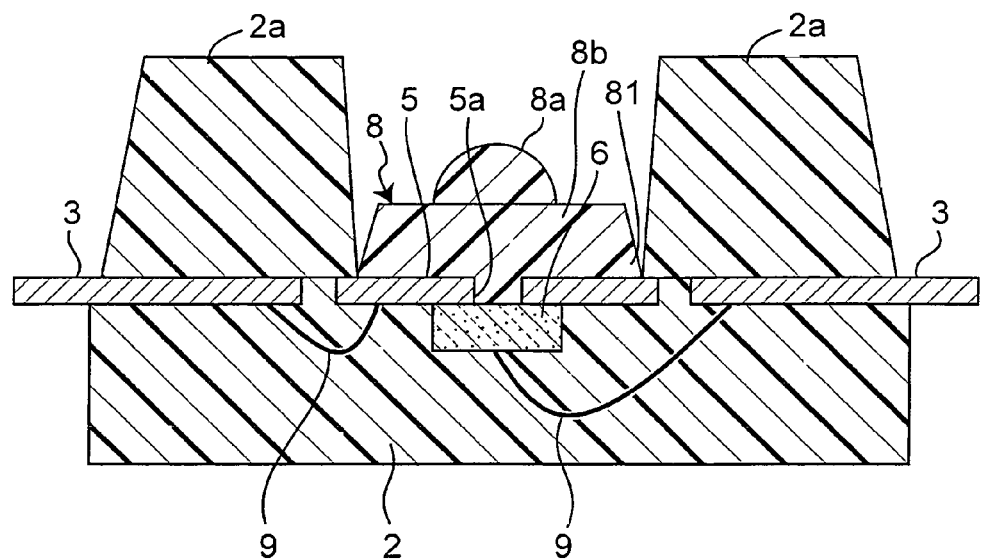
FIG. 7 is a sectional view showing the optical device package structure of the sixth embodiment.

FIG. 7 is a sectional view showing the optical device package structure of the sixth embodiment.

The optical device package structure of the sixth embodiment differs from the optical device package structure of the first embodiment only in the construction of the crack prevention structure. In the sixth embodiment, the same components as those of the first embodiment are denoted by the same reference numerals, and no detailed description is provided therefor.

The optical device package structure of the present embodiment has a crack prevention structure similar to the crack prevention structure of the optical device package structure of the fifth embodiment. That is, the light-transmitting resin 8 is formed of a lens portion 8a and a base portion 8b that supports the lens portion 8a, and the area of base portion 8b, or the area of the light-transmitting resin 8 is made smaller than the area of the mounting portion 5 of the lead frame when viewed from the light-emitting direction of the LED 6. In this case, since the light-transmitting resin 8 is formed with necessary minimum dimensions for the transmission of the light of LED 6, there are cases where the package structure cannot be aligned by using the surface of the light-transmitting resin 8.

Accordingly, a part 2a of a low-stress resin is placed on a surface of the lead frames 3 and 5 on the side on which the light-transmitting resin 8 is placed and at least in a portion other than the portion where the light-transmitting resin 8 is placed located with regard to. By using the surface of the part 2a of the low-stress resin, the package structure can be aligned with the equipment on which the package structure is to be mounted. It is proper to obstruct the inflow of the material of the low-stress resin by placing a pin or the like in a position of a portion that serves as an optical path in which the light-transmitting resin 8 is to be placed when the low-stress resin 2 is molded to the lead frames 3 and 5.

When the base portion 8b of the light-transmitting resin 8 is formed with a reduced thickness, the part 2a of the low-stress resin may be formed on the surface of the lead frames 3 and 5 on the side on which the light-transmitting resin 8 is placed. Even when positional alignment cannot be achieved by the base portion 8b of the light-transmitting resin 8 formed with a reduced thickness, the positional alignment of the package structure can be achieved by the surface of the part 2a of the low-stress resin.

SEVENTH EMBODIMENT

Figure 8:
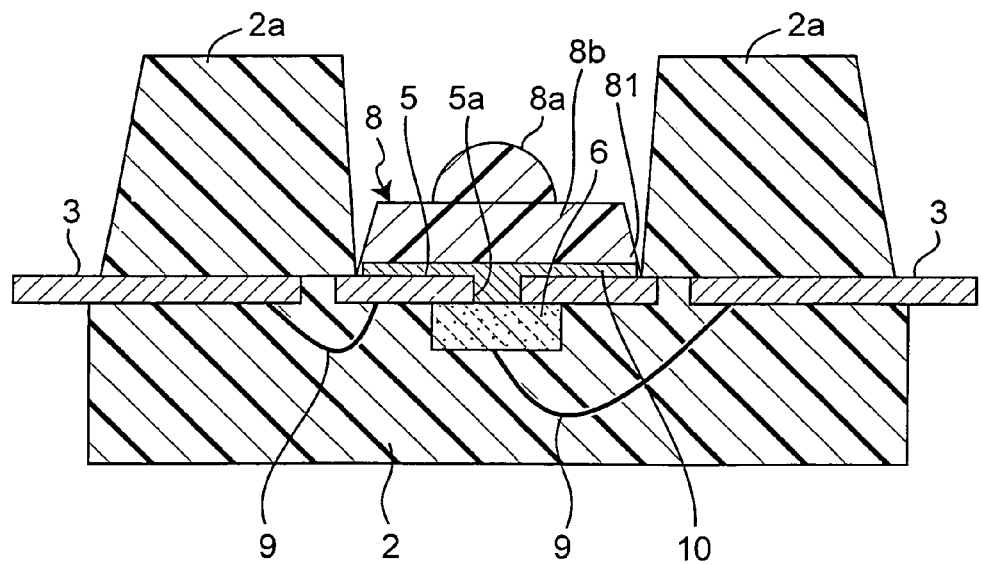
FIG. 8 is a sectional view showing the optical device package structure of the seventh embodiment.

FIG. 8 is a sectional view showing the optical device package structure of the seventh embodiment.

The optical device package structure of the seventh embodiment differs from the optical device package structure of the sixth embodiment only in the construction of the crack prevention structure. In the seventh embodiment, the same components as those of the sixth embodiment are denoted by the same reference numerals, and no detailed description is provided therefor.

The crack prevention structure owned by the optical device package structure of the seventh embodiment is constituted by bonding the light-transmitting resin 8 to at least the mounting portion 5 of the lead frame with an adhesive in addition to the fact that the area of the light-transmitting resin 8 is smaller than the area of the mounting portion 5 of the lead frame when viewed from the light-emitting direction of the LED 6. The light-transmitting resin 8 is formed of a lens portion 8a and a base portion 8b that supports the lens portion 8a, and a lower portion of the base portion 8b is bonded to at least the mounting portion 5 of the lead frame with an adhesive material.

If the light-transmitting resin 8 is formed integrally with the lead frames 3 and 5 by insert molding, a residual stress, which is attributed to a stress due to molding shrinkage, a thermal stress due to a temperature difference from the temperature at the curing start time of the light-transmitting resin to the ambient temperature and the like, is generated in the light-transmitting resin 8. The residual stress becomes a cause of the generation of cracks in the light-transmitting resin 8.

In this case, according to the present embodiment, the light-transmitting resin 8 is formed separately from the lead frames 3 and 5, and the light-transmitting resin 8 is fixed to at least the mounting portion 5 of the lead frame with an adhesive material 10. With this arrangement, only the thermal stress due to the temperature difference between the temperature at the curing start time of the light-transmitting resin and the ambient temperature becomes the cause of the residual stress, and therefore, the possibility of the generation of cracks in the light-transmitting resin 8 can be reduced. Further, by making the adhesive material 10 function as a buffer of the stress, the generation of cracks in the light-transmitting resin 8 can effectively be prevented.

In concrete, a material that has a glass transition point lower than the lowest storage temperature of the package of the optical device should preferably be used as the adhesive material 10. With this arrangement, the adhesive material 10 can be formed into a rubbery state in a normal environment in which the optical device package is used. With this arrangement, the young's modulus of the adhesive material 10 can be reduced, and therefore, the difference in the stress between the lead frames 3 and 5 and the light-transmitting resin 8 fixed by the adhesive material 10 can be eased. Therefore, the generation of cracks can effectively be prevented by effectively preventing stress concentration to the light-transmitting resin 8.

Moreover, by using the adhesive material 10 that has a curing point of not lower than the lowest storage temperature and not higher than the highest storage temperature of the optical device package, the temperature difference from the curing point to the ambient temperature can be reduced during the process of the curing of the adhesive material 10. Therefore, the thermal stress generated at the time of curing the adhesive material 10 can be reduced, and the generation of cracks in the light-transmitting resin 8 can effectively be prevented. The curing point of the adhesive material 10 should preferably have a value obtained by arithmetically averaging the value of the lowest storage temperature and the value of the highest storage temperature-of the optical device package.

In the fourth through seventh embodiments, the forming method of the light-transmitting resin 8 is not specifically limited. On the other hand, since the low-stress resin 2 seals the LED 6, the wires 9 and so on, transfer molding should preferably be used in order to reduce the residual stress in these parts.

Moreover, it is preferable to use no mold release agent for the low-stress resin 2. This is because, if a mold release agent is used for the low-stress resin, the mold release agent might exude from low-stress resin and adversely affect the adhesion between the low-stress resin and the light-transmitting resin when the light-transmitting resin is formed after the formation of the low-stress resin.

Moreover, the LED 6 may be another optical device of, for example, CCD, VCSEL or PD.

Moreover, the shapes of the light-transmitting resin 8 and the low-stress resin 2 are not limited to the rectangular parallelepiped shape but changeable to other shapes at need.

Moreover, the shape of the lead frame can be changed to another shape at need. For example, the mounting portion 5 and the lead portions 3 may be integrally formed, and any number of lead portions 3 may be provided.

Table 3 is a table that shows calculation results obtained by calculating by FEM simulation the maximum shearing stress generated in the end portions 81 (in the same position as the position B of Table 2) of the light-transmitting resin with regard to the optical device package structures of the fourth, fifth and seventh embodiments. The FEM simulation was carried out by calculations on the same conditions as those of the FEM simulation by which the results of Table 2 were obtained. It is noted that the fifth embodiment had a plurality of lenses 8a and base portions 8b, and the calculations were also carried out for the light-emitting resin 8 such that the plurality of lenses 8a and base portions 8b were mutually separated. Moreover, calculations were carried out also for one of which the light-transmitting resin 8 had a thickness of 0.5 mm in the fifth embodiment. Moreover, calculations were carried out for a case where silicone was used as a resin contained in the adhesive 10 and a case where the curing point was 75° C. in the seventh embodiment. Table 3 additionally shows the calculation results of the first embodiment for the sake of comparison.

TABLE 3

|  | Maximum shearing stress (MPa) |
| --- | --- |
| First embodiment | 28 |
| Fourth embodiment | 23 |
| Fifth embodiment (separated every lens and base portion) | 22 |
| Fifth embodiment | 25 |
| Fifth embodiment (thin type) | 20 |
| Seventh embodiment (silicone) | 2 |
| Seventh embodiment (curing point: 75° C.) | 14 |

As is apparent from Table 3, the optical device package structures of the fourth, fifth and seventh embodiments are allowed to further reduce the shearing stress of the light-transmitting resin 8 than in the first embodiment. Therefore, it can be said that the generation of cracks in the light-transmitting resin 8 can more effectively be prevented.

The invention claimed is:

1. An optical device package structure comprising:
   an optical device;
   a lead frame having a mounting portion on which the optical device is mounted and a lead portion electrically connected to the optical device;
   a wire placed on a side of the lead frame on which side the optical device is mounted and electrically connecting the optical device with the lead portion;
   a first resin transmissive to light and through which light incident on or emitted from the optical device passes; and
   a second resin at least part of which is placed on the side of the lead frame on which the optical device is mounted, the second resin sealing the optical device and the wire and having a coefficient of linear expansion lower than that of the first resin.

2. The optical device package structure as claimed in claim 1, further comprising a crack prevention structure preventing the first resin from cracking, wherein
   the crack prevention structure comprises:
   a bent portion provided at the lead portion a of the lead frame and bent toward the side on which the optical device is mounted;
   a portion of the second resin located on the side opposite from the side on which the optical device is mounted with respect to the bent portion; and
   an end portion of the first resin put in contact with the portion of the second resin.

3. The optical device package structure as claimed in claim 1, further comprising a crack prevention structure preventing the first resin from cracking, wherein
   the crack prevention structure comprises:
   a recess portion provided at the lead portion of the lead frame and having a concavity on the side opposite from the side on which the optical device is mounted;
   a portion of the second resin located inside the recess portion; and
   an end portion of the first resin put in contact with the portion of the second resin.

4. The optical device package structure as claimed in claim 1, further comprising a crack prevention structure preventing the first resin from cracking, wherein
   the crack prevention structure comprises:
   a bent portion provided at the lead portion of the lead frame and bent toward the side on which the optical device is mounted; and
   an end portion of the first resin having an end surface that is aligned with an edge of the bent portion.

5. The optical device package structure as claimed in claim 4, wherein
   the end surface of the end portion of the first resin is roughly flush with a surface of the bent portion located on the side opposite from the side on which the optical device is mounted.

6. The optical device package structure as claimed in claim 1, wherein
   the second resin is a material that can be formed by transfer molding.

7. The optical device package structure as claimed in claim 1, wherein
   the second resin contains no mold release agent.

8. The optical device package structure as claimed in claim 1, wherein
   the first resin contains filler that reduces the coefficient of linear expansion of the first resin.

9. The optical device package structure as claimed in claim 1, further comprising a crack prevention structure preventing the first resin from cracking, wherein
   the crack prevention structure comprises the first resin,
   the first resin has a lens portion that collects light incident on or emitted from the optical device and a base portion that is continuous to the lens portion, and
   the base portion has a thickness of not greater than 0.5 mm.

10. The optical device package structure as claimed in claim 1, further comprising a crack prevention structure preventing the first resin from cracking, wherein
    the crack prevention structure comprises the first resin, and
    the first resin has a lens portion that collects light incident on or emitted from the optical device and a base portion continuous to the lens portion and has an area smaller than an area of the mounting portion of the lead frame when viewed from a direction of emission or incidence of the light.

11. The optical device package structure as claimed in claim 10, wherein
the base portion has a thickness smaller than a thickness of the lens portion.

12. The optical device package structure as claimed in claim 10, wherein
the second resin has a part placed on the side opposite from the side of the lead frame on which the optical device is mounted, and the part of the second resin is placed at least in a part of a portion other than the portion of the lead frame where the first resin is placed.

13. The optical device package structure as claimed in claim 1, further comprising a crack prevention structure preventing the first resin from cracking, wherein
the crack prevention structure comprises the first resin, and
the first resin has a lens portion that collects light incident on or emitted from the optical device and a base portion continuous to the lens portion (8a) and is bonded to at least the lead frame with an adhesive material.

14. The optical device package structure as claimed in claim 13, wherein
the adhesive material contains a resin that has a glass transition point lower than a lowest storage temperature.

15. The optical device package structure as claimed in claim 13, wherein
the adhesive material contains a resin that has a curing point of not lower than a lowest storage temperature and not higher than a highest storage temperature.

16. The optical device package structure as claimed claim 1, further in comprising a crack prevention structure preventing the first resin from cracking, wherein
the crack prevention structure comprises the first resin, and
the first resin has a plurality of lens portion that collect light incident on or emitted from the optical device and a plurality of base portions continuous to the respective lens portions, and the plurality of combined lens portions and base portions are mutually separated.

17. The optical device package structure as claimed in claim 1, wherein
the first resin is disposed on a side opposite from the side of the lead frame on which the optical device is mounted, and
the mounting portion of the lead frame has an aperture through which the light incident on or emitted from the optical device passes.

18. The optical device package structure as claimed in claim 1, wherein at least an outer end portion of the lead portion of the lead frame projects in a non-supported manner outwardly from both the first resin and the second resin.

* * * * *